United States Patent [19]

DeSouza et al.

[11] Patent Number: 5,379,289
[45] Date of Patent: Jan. 3, 1995

[54] MEDIA ACCESS CONTROLLER

[75] Inventors: Edwin Z. DeSouza, San Jose; Daniel J. Cimino, Sunnyvale, both of Calif.

[73] Assignee: National Semiconductor Corporation, Santa Clara, Calif.

[21] Appl. No.: 93,458

[22] Filed: Jul. 16, 1993

Related U.S. Application Data

[63] Continuation of Ser. No. 459,439, Jan. 2, 1990, abandoned.

[51] Int. Cl.$^6$ .......................... H04L 12/46; H04J 3/26
[52] U.S. Cl. .................................. 370/85.13; 370/94.1
[58] Field of Search ................. 370/85.1, 85.13, 85.14, 370/60, 60.1, 92, 94.1, 94.2, 94.3; 340/825.52

[56] References Cited

U.S. PATENT DOCUMENTS

| | | | |
|---|---|---|---|
| 4,661,951 | 4/1987 | Segarra ................... | 370/92 |
| 4,730,308 | 3/1988 | Friedman et al. ............. | 370/85.1 |
| 4,737,953 | 4/1988 | Koch et al. .................. | 370/94 |
| 4,742,572 | 5/1988 | Yokoyama ................... | 370/92 |
| 4,787,083 | 11/1988 | Tanaka ........................ | 370/85.1 |
| 4,879,715 | 11/1989 | Nakabayashi et al. ........ | 370/92 |
| 4,903,016 | 2/1990 | Murai et al. .................. | 370/92 |
| 4,916,692 | 4/1990 | Clarke et al. ................. | 370/85.1 |
| 4,933,846 | 6/1990 | Humphrey et al. ........... | 370/85.1 |
| 5,050,165 | 9/1991 | Yoshioka et al. ............. | 370/85.13 |
| 5,058,109 | 10/1991 | Goldberg et al. ............. | 370/85.13 |
| 5,081,621 | 1/1992 | Sugimoto ..................... | 370/85.13 |

FOREIGN PATENT DOCUMENTS 331190 9/1989 European Pat. Off. ......... 370/85.13

OTHER PUBLICATIONS

Intel advance data sheets (pp. 1-63) for "82596CA High-Performance 32-Bit Local Area Network Coprocessor".
Intel data sheets (pp. 1-1-1-37) for "82586 Local Area Network Coprocessor".
Intel data sheets (pp. 4-235-4-237) for "386 TM DX Microprocessor".
Motorola MC68030 User's Manual (pp. 7-5-7-25).
"Spanning Tree Bridges: Transparent Bridges for Interconnection of IEEE 802 LANs," by Floyd Backes (IEEE Network, vol. 2, No. 1, Jan. 1988, pp. 5-9).
"Source Routing Bridges: Addressing Bridging, and Source Routing," by Roy C. Dixon and Daniel A. Pitt (IEEE Network, vol. 2, No. 1, Jan. 1988, pp. 25-32).
Dave Bursky, "Content-Addressable Memory Does Fast Matching", Electronic Design, vol. 36. No. 27, Dec. 8, 1988, pp. 119-121.
Bernard C. Cole, "Content-Addressable Memories Catch On", Electronics, vol. 61, No. 18, Dec. 1988, pp. 82-84.
Advanced Micro Devices' data sheets (pp. 1-28) for "Am99C10 256×48 Content Addressable Memory".
Advanced Micro Devices' advanced data sheets (pp. i-vi, 1-106) for "Am79C900 Integrated Local Area Communications Controller (ILACC)".

Primary Examiner—Douglas W. Olms
Assistant Examiner—Hassan Kizou
Attorney, Agent, or Firm—Limbach & Limbach

[57] ABSTRACT

A media access controller is provided by the present invention. A feature of the media access controller of the present invention is a content addressable memory architecture whereby address filtering is provided for filtering physical, group and broadcast addresses on an Ethernet network. Another feature of the present invention is an interface architecture capable of supporting external address filters which in turn are capable of supporting spanning tree and source routing algorithms. Still another feature of the present invention is a CRC checker having improved testability such that burdensome computations for input bit test patterns are no longer required. Still another feature of the present invention is a first-in, first-out memory register having validity bits associated with each stored data byte, such that data bytes may be indiscriminately stored, regardless of their validity, and invalid data bytes are discarded during retrieval of the stored data bytes.

24 Claims, 14 Drawing Sheets

MEDIA ACCESS CONTROLLER

This is a continuation of co-pending application Ser. No. 07/459,439 filed on Jan. 2, 1990, now abandoned.

BACKGROUND OF THE INVENTION

1. Field of the Invention

The present invention relates to digital circuits used to control the flow of binary data within a local area network. In particular, the present invention relates to a network interface controller which manipulates and controls the flow of binary data between a digital system and a local area network shared by that digital system with other digital systems.

2. Description of the Related Art

As digital data communications systems have become more sophisticated, users of such systems have been able to more fully take advantage of this sophistication by interconnecting several digital systems via a network (e.g., a local area network or "LAN"). A network promotes synergy among the systems by allowing them to communicate with each other and share applications and data. However, with several systems trying to communicate with each other, some form of communications protocol must be observed lest communication pandemonium result. By establishing an appropriate communications protocol, the sharing of applications and data among the systems sharing the network can be accomplished in an efficient and orderly manner. One example of such a communications protocol which is quite common is called "Ethernet."

As is known in the art, Ethernet is a commonly used term for a communications protocol standard. It is also known as "Carrier Sense with Multiple Access and Collision Detect" ("CSMA/CD") and is defined by the Institute of Electrical and Electronics Engineers' (I.E.E.E.) standard 802.3.

FIG. 1 is a simplified, functional block diagram of a typical integrated Ethernet interface 10 with an ordinary media access controller ("MAC") 11 and network and system interfaces. The primary functional elements of this interface 10 are: a MAC 11; a media attachment unit ("MAU") 13; an attachment unit interface ("AUI") 12; an encoder/decoder 14; a deserializer and receiver interface 16; a serializer and transmitter interface 18; a receiver first-in, first-out ("FIFO") register 20; a transmitter FIFO 22; and a system interface 24.

The AUI 12 provides the appropriate logic and circuitry needed to interconnect with and communicate over the network medium via the MAU 13. The encoder/decoder 14 provides the data encoding and decoding functions needed for communicating over the Ethernet network. During reception, the encoder/decoder 14 decodes Manchester encoded data received from the network medium via the MAU 13 into non-return-to-zero ("NRZ") formatted data for utilization by the user system (not shown). The encoder/decoder 14 also recovers a received data clock for the NRZ data from the Manchester encoded signal. The received NRZ data and clock are sent to the deserializer and receiver interface 16.

During transmission, the encoder/decoder 14 combines the NRZ data and data clock signals into Manchester encoded data which is sent to the AUI 12 for transmission onto the network medium. The encoder/decoder 14 further provides a "carrier sense" signal which indicates the presence of a data signal on the network medium and a "collision sense" signal which indicates the presence of a transmission collision (two user systems attempting to transmit simultaneously) within the Ethernet network.

The deserializer and receiver interface 16 monitors the incoming serial NRZ data 26 provided by the encoder/decoder 14 during reception. After detecting a start-of-frame delimiter ("SFD") pattern within the Ethernet signal, the deserializer and receiver interface 16 then frames the incoming data bits 26 into eight-bit wide bytes and transfers this byte-wide data 28 to the receiver FIFO 20. The data stored in the receiver FIFO 20 is then transferred via the system interface 24 to the user system (not shown).

During data transmission, the transmitter FIFO 22 stores data received from the user system via the system interface 24. This stored data is transferred in eight-bit wide bytes to the serializer and transmitter interface 18. The serializer and transmitter interface 18 converts this byte-wide data 30 to a serial NRZ data stream and clock 32 for transfer to the encoder/decoder 14.

Further communication and sharing of instructions and data is accomplished among the primary elements 16, 18, 20, 22, 24 of the interface 10 by way of a parallel data bus 34.

FIG. 2 is a functional block diagram illustrating in more detail the deserializer and receiver interface 16. Its primary elements, a deserializer 36, a cyclic redundancy check ("CRC") checker 38 and a receiver state machine 40, interconnect with the encoder/decoder 14, receiver FIFO 20 and system interface 24. As described above, the deserializer 36 accepts the incoming serial NRZ data and recovered received data clock 26 from the encoder/decoder 14 and converts it to eight-bit wide bytes of data 28 for transfer to the receiver FIFO 20. The CRC checker 38 calculates the four-byte frame check sequence ("FCS") field from the incoming data stream 26 and compares it with the last four bytes of the received packet of data 26 to verify data integrity. The receiver state machine 40 contains the command, control and status registers that govern the operations of the deserializer 36 and CRC checker 38. The receiver state machine 40 further generates control signals for instructing the receiver FIFO 20 to store its incoming data 28 and processes CRC error signals received from the CRC checker 38.

In order to take further advantage of the sophistication and versatility of today's digital systems, a network "bridge" may be constructed whereby networks of interconnected digital systems are themselves interconnected. In other words, a network having multiple digital systems interconnected therein may be coupled so as to interconnect with another network also having multiple digital systems interconnected therein.

FIG. 3 illustrates a simplified, functional block diagram of a network bridge 50. FIG. 3 illustrates the situation where three networks are bridged. However, conceivably, virtually any number of networks may be bridged together. The bridging of the multiple networks is accomplished by a system bus 52. It is over this system bus 52 that the three networks 54, 56, 58 communicate via their respective MACs 60, 62, 64. The bridging operation is controlled by the system CPU 66 and the information to be bridged from one network to another is buffered by the system memory 68.

The operation and/or configuration of the typical MAC present several problems. One problem involves the handling of received data that has been decoded and deserialized. Current MACs process all information appearing on the network for storage within the user system (not shown). It is then up to the user system to devote time and software for determining whether to retain and use that processed information or to discard it. One way of making this determination is to examine the destination address field within the incoming Ethernet data packet to determine if the data packet is intended for that particular user's system. Current MACs only support a single physical address and provide no support for restricted group usage or multiple service access points. They also use a non-deterministic "hashing" scheme to examine the incoming address field for filtering out undesired data packets.

A hashing scheme involves the use of a complex mathematical algorithm to distinguish among different address values. For example, one hashing scheme provides for performing a calculation on a 48-bit address field to reduce it to a 32-bit field. The first (i.e., the most significant) six bits are then used as an address to access a 64-bit lookup table wherein a logical one or zero has been stored to indicate whether to accept or reject, respectively, the data packet containing the original 48-bit address field.

Although the hashing scheme may distinguish between specific, individual addresses, it does not guarantee generating different "hash" values for different addresses. Therefore, the hashing filter may sometimes incorrectly recognize addresses, thereby rendering it useless for user systems which demand deterministic address recognition. Such shortcomings in the address filtering capability of current MACs have required system designers to use complex external circuitry and software filters to provide the necessary filtering (e.g., routers and bridges, as discussed more fully below).

Thus, it would be desirable to have an address filtering scheme which does not require the use of the complex mathematical algorithms used in a hashing scheme. It would be further desirable to have an address filtering scheme which is deterministic and therefore capable of recognizing each and every potential individual address. It would be still further desirable to have an address filtering scheme which not only supports single physical addresses but also supports restricted group usage and multiple service access points.

A second problem involves the network bridge 50 discussed above for FIG. 3. This problem is similar to that just discussed, in that it involves address filtering. The purpose of the bridge 50 is to monitor the data packets generated within one network, via the associated MAC, and determine whether that data packet is intended to be used within that network or within another network. If the data packet is intended for use within another network, the bridge 50 must capture and retain that data packet and route, or "bridge," that data packet to the appropriate network.

For example, in FIG. 3, a data packet generated in network A is captured and retained by its associated MAC A and placed on the system bus 52 for temporary storage within the system memory 68. The bridge 50 then, through appropriate programming of the system CPU 66, determines whether that data packet stored in the system memory 68 was intended for use within the original network A, or was intended to be bridged to networks B and/or C (via their associated MACs B, C). If intended for network B and/or C, the data packet is read out from the system memory 68 over the system bus 52 and transferred to the MAC(s) of the appropriate network(s). However, if the data packet was intended for use only within network A, then the use of the system bus 52 and system memory 68 to transfer and store that data packet was not only inefficient usage of the bus 52 and memory 68, but was also counterproductive. This counterproductivity arises from the unavailability of the system bus 52 and system memory 68 for the bridging of other data packets which are intended for transfer to and use within other networks served by the bridge 50.

Thus, it would be desirable to have some form of MAC support for address filtering which would make an early determination as to whether a data packet generated by one network needs to be bridged to other networks. Such an early determination would minimize usage of the system bus 52 and system memory 68 to buffer data packets, or portions thereof, which are subsequently determined not to be bridged, and therefore not to be buffered. This would make the system bus 52 and system memory 68 available more often, thereby increasing the effective throughput of the bus 52 and bridge 50. It would be further desirable that such address filtering be versatile enough to support multiple network bridging algorithms (e.g., spanning tree and source routing).

A still further problem with current MACs involves the CRC checker 38. FIGS. 4 and 5 illustrate in functional block diagram form a typical CRC checker 38. The primary functional elements include multiple exclusive-OR gates 70 and single-bit shift register elements 72, plus a CRC comparator 74, which in turn, is made up of several AND gates 76 and two inverters 78 (See FIG. 5).

The incoming serial NRZ data 26 passes through the exclusive-OR gates 70 and shift register elements 72 as shown in FIG. 4. This combinational logic 70, 72 produces a binary result 80 which is a parallel binary signal made up of the 32 output bits from the shift register elements 72. This 32-bit wide signal 80 is compared within the CRC comparator 74 to see whether any errors have been introduced into the data packet prior to its arrival at the CRC checker 38. The CRC comparator 74 illustrated in FIG. 5 is designed to check for the CRC bit pattern: 1100 0111 0000 0100 1101 1101 0111 1011.

Using a CRC scheme to detect errors in data transmission is known in the art. Discussions of the algorithms involved and examples thereof may be found in: "The Great CRC Mystery", by Terry Ritter, published in *Dr. Dobb's Journal*, February 1986; and "Calculating CRCs By Bits And Bytes", by Greg Morse, published in BYTE magazine, September 1986. A discussion and example specifically involving Ethernet may be found in "The Ethernet, A Local Area Network, Datalink Layer and Physical Layer Specifications", Sep. 30, 1980, published jointly by Digital Equipment Corporation, Intel Corporation and Xerox Corporation.

The specific problem related to the CRC checker 38 is that of testability. As with any integrated circuit, following fabrication thereof the circuitry constituting the CRC checker 38 must undergo functional electrical testing. In order to fully test all circuit interconnections, all bit permutations of the 32-bit input signals 26 must be clocked through the exclusive-OR gates 70 and shift register elements 72. By doing this, it can be determined conclusively whether only one bit pattern produces a condition of no CRC error. Therefore, a total of $2^{32}$ different 32-bit patterns must be serially shifted through these logic elements 70, 72 to conclusively determine the integrity of the circuit connections within the CRC checker 38. Inputting such a large number of such long bit patterns for testing requires a relatively large amount of time, even with automated test equipment.

Furthermore, due to the effects of the logic elements 70, 72 (see articles referenced above), the $2^{32}$ unique 32-bit patterns must be calculated, one for each of the $2^{32}$ different 32-bit patterns to be tested, so that all bit permutations will be included in the test. Such a large number of bit permutation calculations is burdensome and time consuming, even with the aid of automated test equipment. Thus, it would be desirable to have a circuit for a CRC checker 38 which would provide the requisite CRC checking function, but which would not require the extensive and burdensome bit permutation calculations and the prolonged test time associated therewith.

A still further problem involves the transmitter FIFO 22 and its buffering of data intended for transmission into the network. The system interface 24, when fetching data fragments from the user system (not shown), fetches four bytes (i.e., a double word) at a time when a 32-bit wide data bus is used (or two bytes (single word) when a 16-bit wide data bus is used). Since not all data fragments necessarily contain a number of bytes which is evenly divisible by four (or two), this necessarily means that some of the bytes fetched by the system interface 24 will be invalid. However, prior to transmission, all such invalid data must be eliminated. In other words, only valid data bytes are to be transmitted into the network, with no invalid data bytes intertwined therewith.

Currently, to ensure that only valid data is buffered by the transmitter FIFO 22 for transmission into the network, the MAC must be programmed to examine the data that it fetches from the user system (not shown) and filter out or otherwise discard any invalid data bytes. Depending upon how misaligned the desired data bytes are within the user system, realignment of the byte boundaries for valid data bytes can consume a great deal of processing time and require complex programming. Furthermore, this programming requires sufficient program memory within the MAC to support this realignment process, memory which could otherwise be used for more productive purposes.

Therefore, it would be desirable to have a simplified method and/or circuit which would either filter out invalid data bytes or eliminate the need for such filtering. It would be further desirable to provide for such elimination of invalid data bytes without requiring overhead software to support this process. It would be still further desirable to provide for this elimination of invalid data bytes within the transmitter FIFO 22, thereby freeing up the system interface 24 and/or user system for more productive operations.

SUMMARY OF THE INVENTION

A media access controller ("MAC") in accordance with the present invention provides a content addressable memory ("CAM") architecture which allows the MAC to quickly determine if incoming data packets received from the network are intended for use by the user system associated with that MAC. The CAM in accordance with the present invention therefore screens, or filters, out data not intended for use by its user system.

A MAC in accordance with the present invention further provides supporting interfaces for external address filtering. This allows external address filters to be used with the MAC to selectively screen or filter out undesired data from a network bridge. This prevents undesired data from unnecessarily tying up the internal bus of the bridge. Thus, the effective through-put and accessibility of the bridge is increased.

A MAC in accordance with the present invention further provides a simplified CRC checker circuit with improved testability. No burdensome bit permutation calculations are required, fewer bit patterns need to be inputted for testing and the bit patterns desired for testing may be inputted directly.

A MAC in accordance with the present invention further provides a transmitter FIFO which screens out invalid data bytes prior to transmission into the network. Validity tag bits are used to identify valid data bytes. During data transmission, only those data bytes having validity tag bits which indicate valid data are read out for transmission. Data bytes having validity tag bits indicating invalid data are simply written over by new data bytes arriving within the transmitter FIFO.

These and other objectives, features, and advantages of the present invention will be readily understood upon consideration of the following detailed description of certain preferred embodiments and the accompanying drawings.

BRIEF DESCRIPTION OF THE DRAWINGS

Throughout the Figures, corresponding elements are designated with like numerals.

DETAILED DESCRIPTION OF THE PREFERRED EMBODIMENTS

Figure 1:
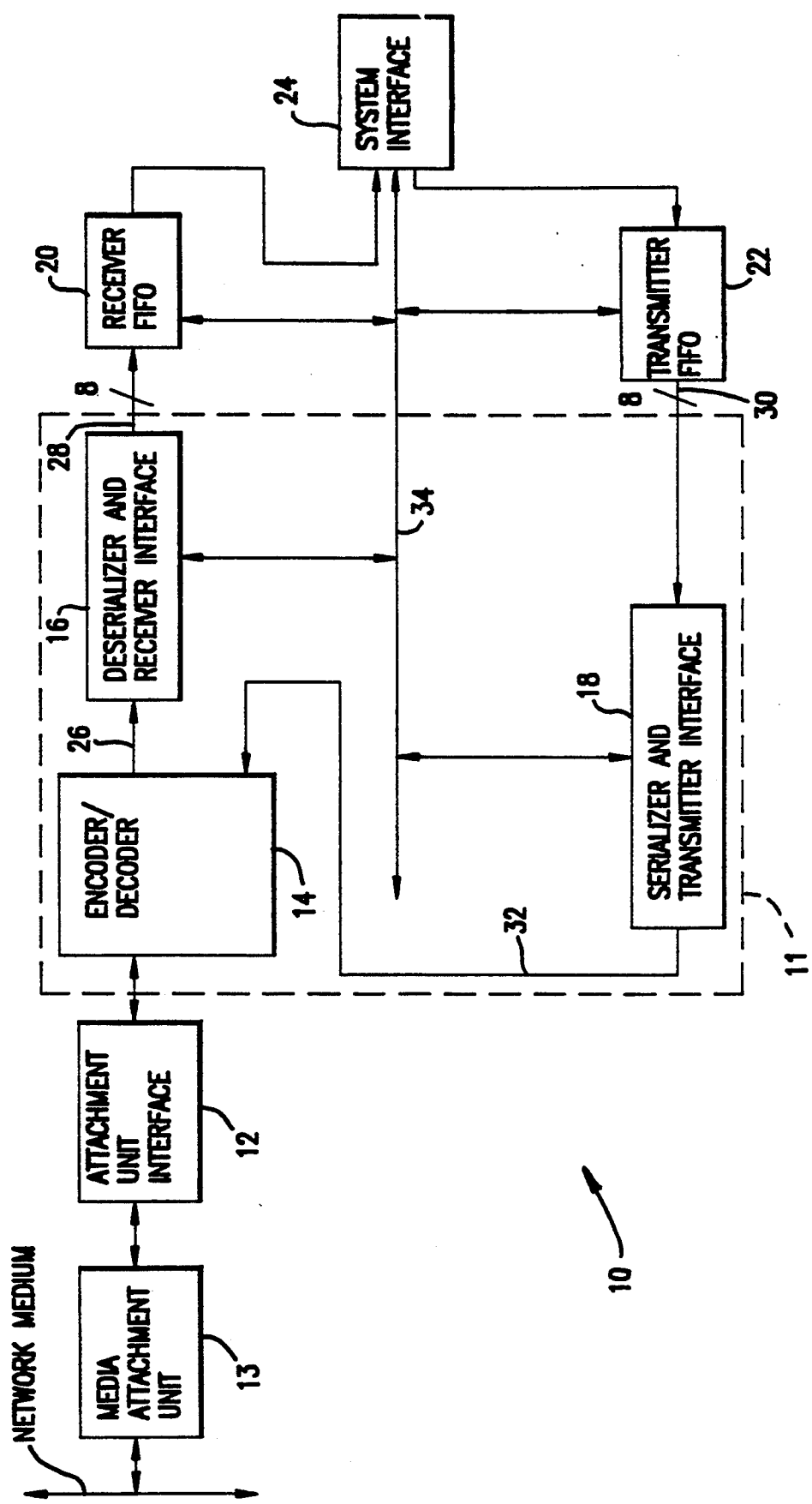
FIG. 1 illustrates in simplified functional block diagram form a typical media access controller.
Figure 2:
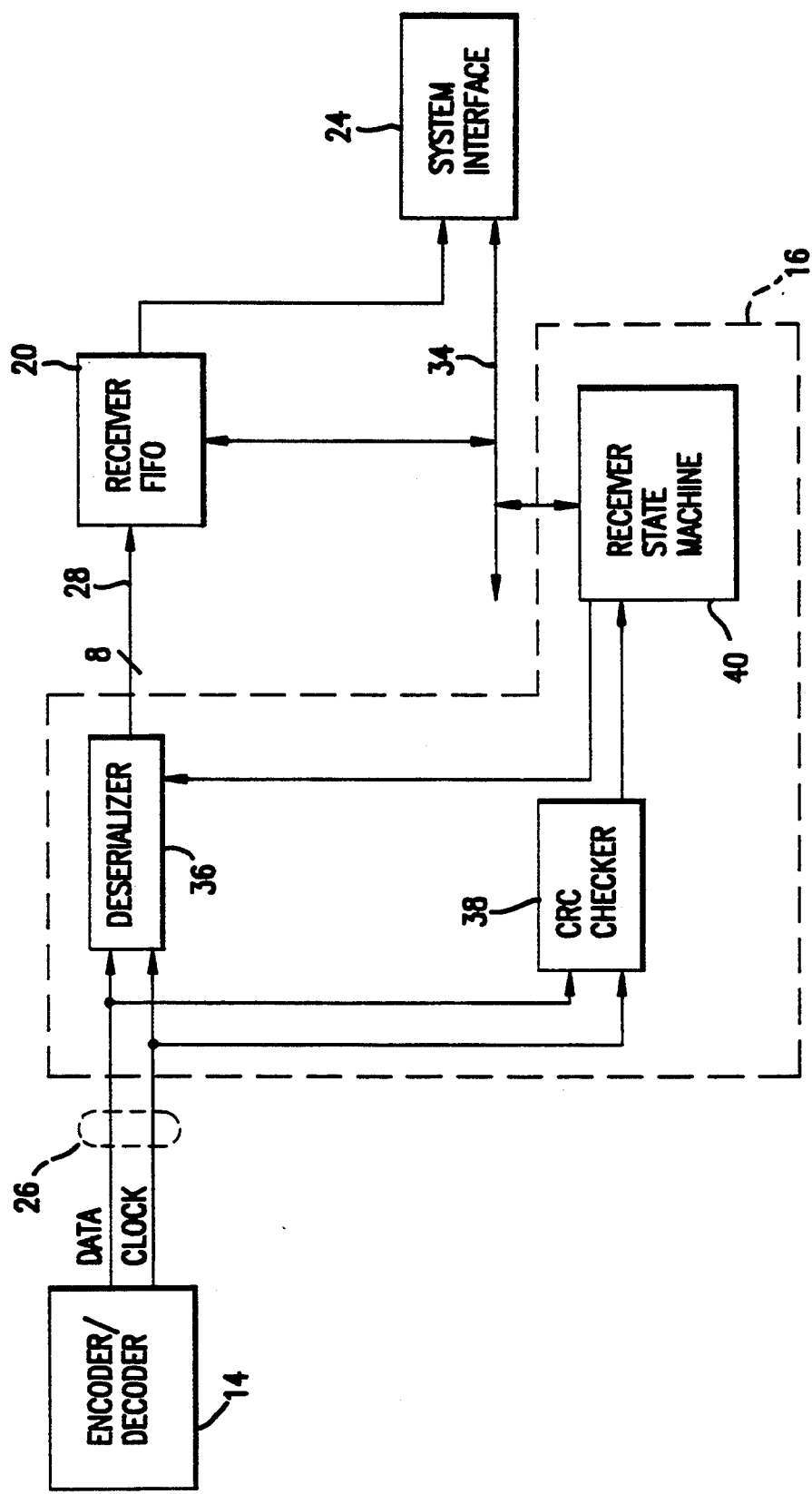
FIG. 2 illustrates in simplified functional block diagram form the receiver path of the media access controller of FIG. 1.
Figure 3:
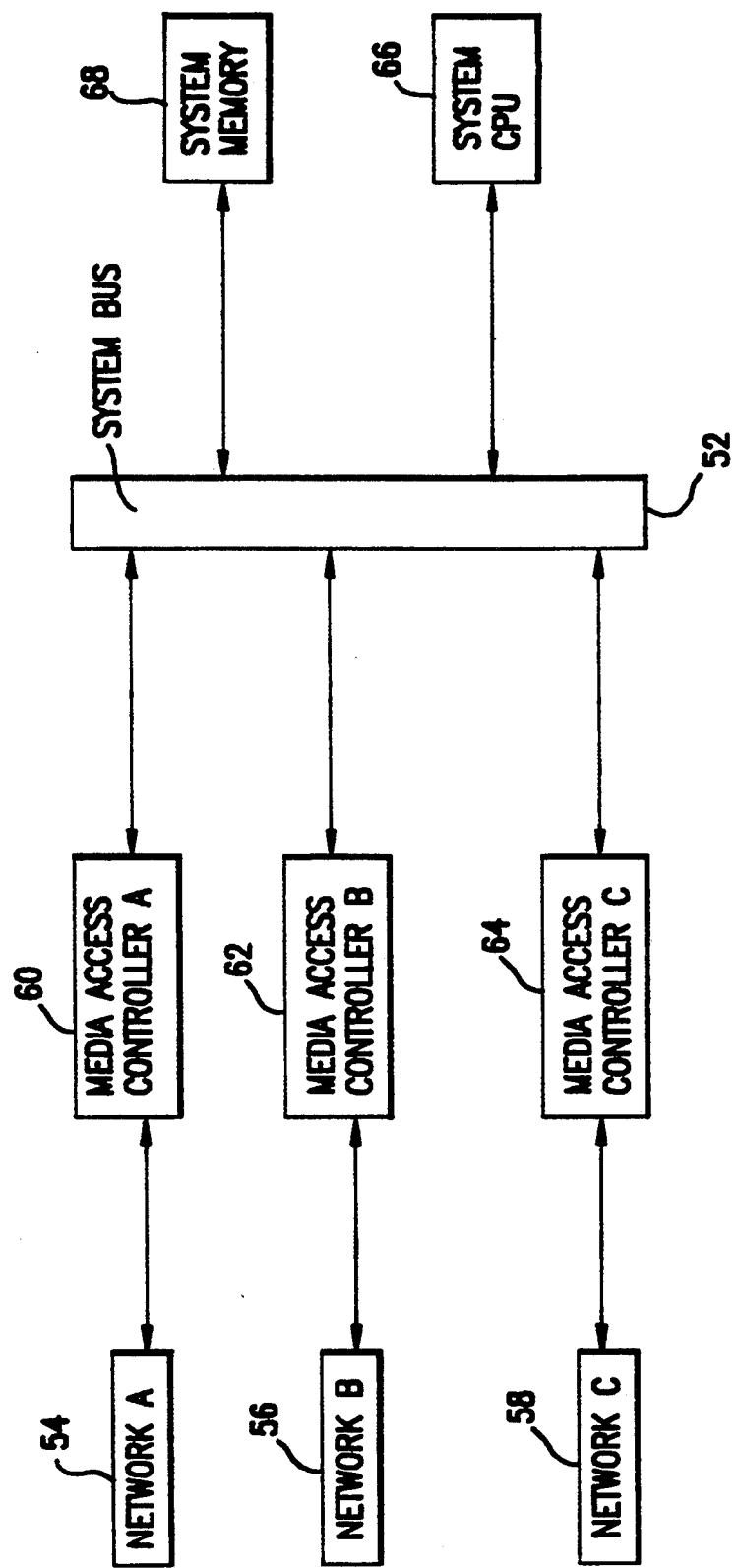
FIG. 3 illustrates in simplified functional block diagram form a network bridge supporting three networks.
Figure 6:
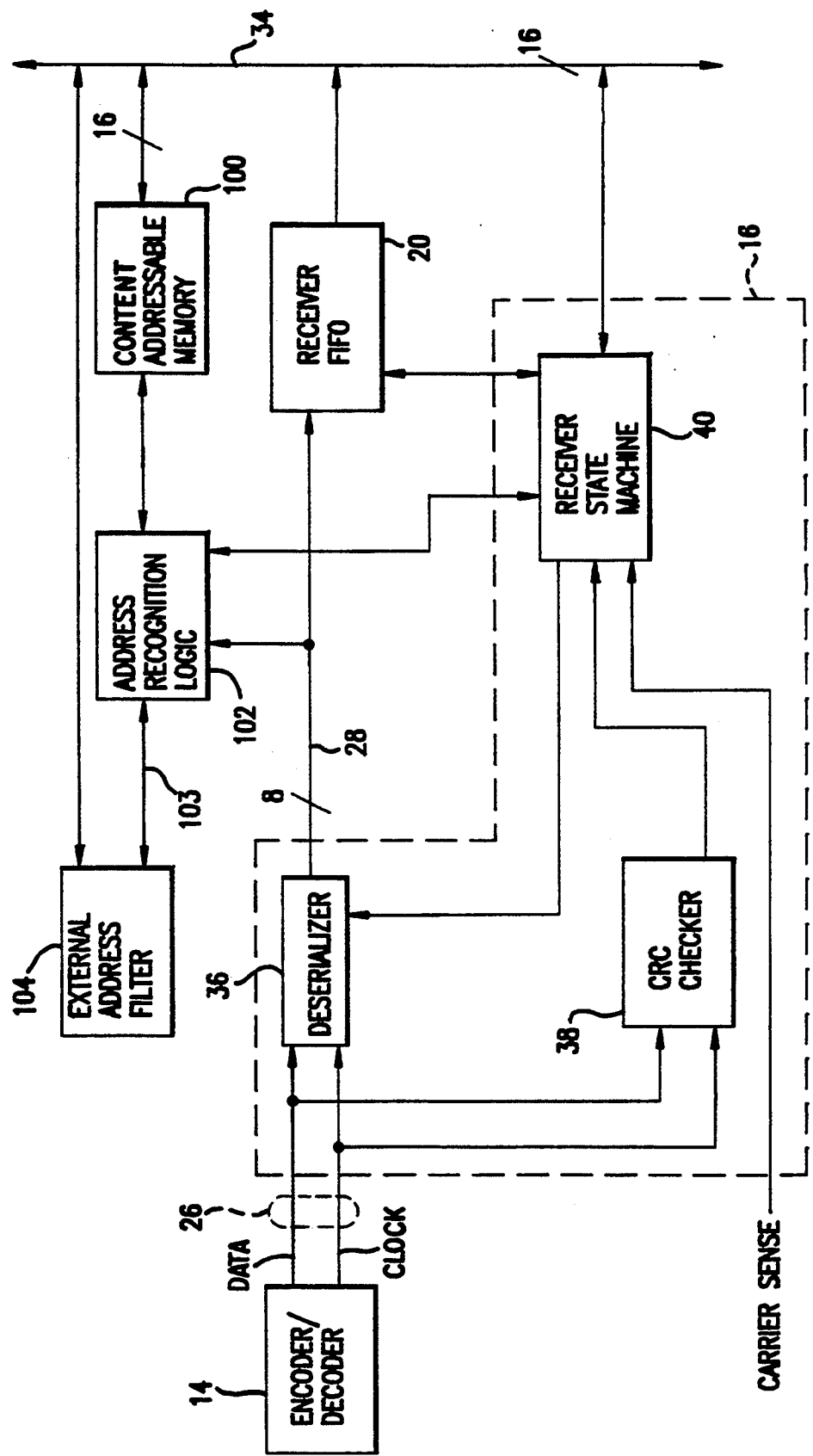
FIG. 6 illustrates in simplified functional block diagram form a media access controller in accordance with the present invention.

FIG. 6 illustrates in simplified functional block diagram form the receiver section of a media access controller ("MAC") in accordance with the present invention. In addition to the primary functional elements of a conventional receiver section as shown in FIG. 2, the receiver section of the MAC of the present invention further includes a content addressable memory ("CAM") 100 and address recognition logic 102. Further included, as discussed more fully below, are interface signals 103 for supporting an external address filter 104.

The CAM 100 is selectively programmed with physical, group and/or broadcast address information. Typically, a physical address specifies a unique system within a network, a group address specifies multiple systems within a network, and a broadcast address specifies all systems within a network. The CAM 100 monitors the destination address field of the incoming data packet via the address recognition logic 102 to quickly determine whether the incoming data packet should be stored for use by the user system, or discarded.

Figure 7:
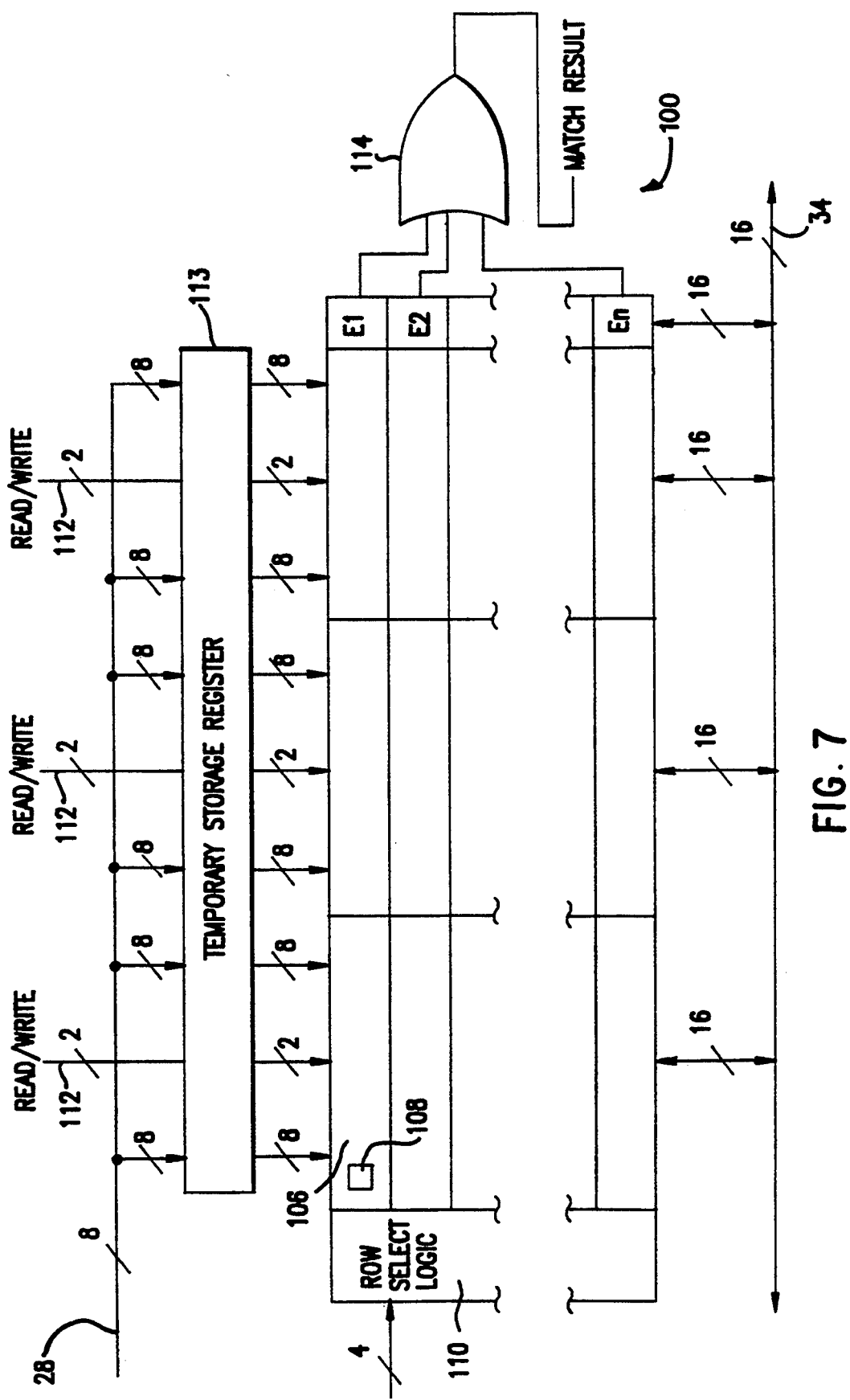
FIG. 7 illustrates in simplified functional block diagram form the content addressable memory architecture of a media access controller in accordance with the present invention.

FIG. 7 illustrates the architecture of a CAM 100 in accordance with the present invention. The CAM 100 contains a row-column matrix of memory cells. The precise number of rows or columns within the matrix is not critical with respect to the CAM 100 of the present invention. In the illustrated embodiment the CAM 100 has sixteen rows and three columns. Each column is two bytes (16 bits) wide. Therefore, the intersection 106 of each row and column constitutes one word of data. Each of the 16 bits in each word 106 is stored in a CAM cell 108. It is within this cell 108 that the address comparison or matching takes place.

The CAM 100 is preprogrammed with reference addresses for matching on a row by row basis. In turn, each row is programmed on a word by word basis. i.e., 16 bits at a time. The three words 106 constituting each reference address arrive via the MAC bus 34 and are loaded into the appropriate rows according to addressing performed by memory pointers (not shown) within the row selector logic 110. The writing of the address information into each row, as well as the reading thereof, is controlled by a two-bit wide read/write signal 112 for each word 106 within each row.

With each programmed reference address, an enabling bit $E_m$ is set. The setting of the enabling bit $E_m$ indicates that a reference address has been programmed into that particular row and serves to enable the comparison or matching of that reference address with an incoming destination address. In an embodiment having 16 rows there are 16 corresponding enabling bits $E_m$. An additional row may be used with all bits set (e.g., hard-wired) to a logical one so as to represent the network broadcast address.

The incoming destination address field within the incoming deserialized data 28 arrives one byte at a time from the deserializer 36 and is written into a 48-bit wide temporary storage register 113. Once all 48 bits of the four-byte destination address field have been written into the temporary storage register 113, all 48 bits are written simultaneously into each row of the CAM 100 for simultaneous comparisons with the pre-programmed reference addresses (described above).

Corresponding bits from the reference address and the incoming destination address are written into identical CAM cells 108. It is within these CAM cells 108 that the matching takes place. If no match results, a logical zero is outputted to the OR gate 114 producing the match result signal. However, if a match does occur, a logical one is outputted to the OR gate 114, thereby producing a logical one output therefrom which indicates a positive match result.

Figure 8:
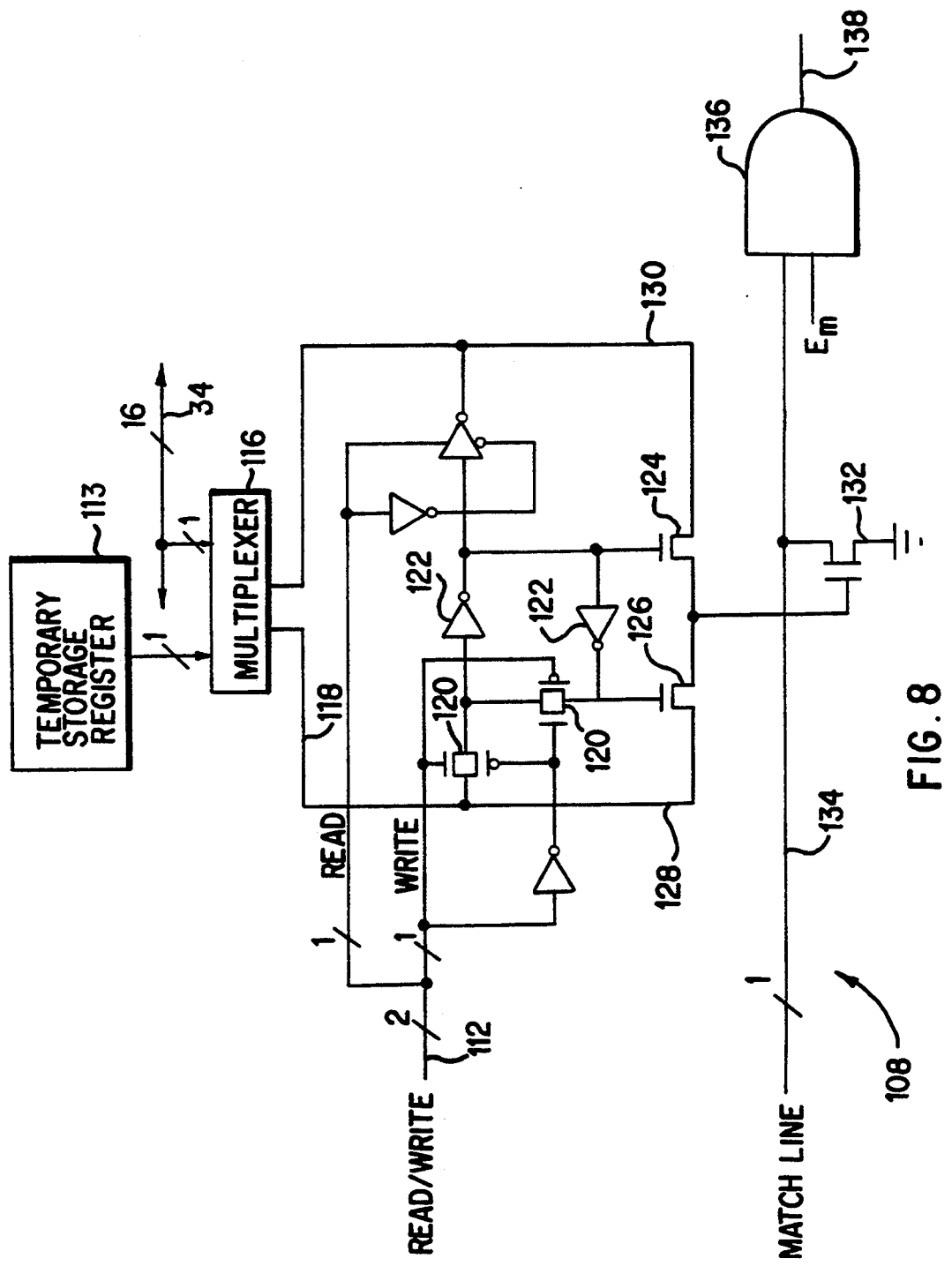
FIG. 8 illustrates in logic and schematic diagram form a CAM cell used in the content addressable memory of a media access controller in accordance with the present invention.

FIG. 8 illustrates in logic and schematic diagram form a CAM cell 108 in accordance with the present invention. As discussed above, it is within this CAM cell 108 that a reference data bit is written and compared with its corresponding incoming destination address bit. The reference address bit comes in via the MAC bus 34 through the multiplexer 116 on the CAM cell input line 118. The pass gates 120, enabled by the incoming read/write signal 112, and the cross-coupled inverters 122 allow electrical charges representing the incoming reference address bit 118 and its inverse to appear at the gates of the coupled metal oxide semiconductor field effect transistors (MOSFETs) 124, 126. Therefore, either the first MOSFET 124 or the second MOSFET 126, but not both, is turned on in its conductive state.

The corresponding incoming destination address bit arrives via the temporary storage register 113 and is inputted to the CAM cell 108 via the multiplexer 116. The multiplexer 116 applies voltages representing the destination address bit 128 and its inverse 130 across the series coupled channels of the MOSFETs 124, 126, as shown in FIG. 8. The logic level associated with this bit 128 or its inverse 130 will pass through whichever MOSFET 124, 126 has been turned on by the reference address bit, as described above, and be applied to the gate of the pull-down MOSFET 132. The coupling of the devices as shown in FIG. 8 and the application of the logic levels as described above result in a logical zero being applied to the gate of the pull-down MOSFET 132 when a match occurs, and a logical one applied when no match occurs.

The application of a logical one to the gate of the pull-down MOSFET 132, i.e., indicative of no match between the corresponding reference and destination address bits, causes the pull-down MOSFET 132 to become conductive. When in its conductive state, the pull-down MOSFET 132 pulls down the voltage potential of the match line 134 (described more fully below) to a logical zero. This logical zero, when presented to the comparison enabling AND gate 136 with the corresponding enabling bit $E_m$, produces a signal 138 indicating no match between the bits. However, if a match does occur, the pull-down MOSFET 132 remains nonconductive and the logical one originally placed on the match line 134 is ANDed with the enabling bit $E_m$ and produces a signal 138 indicative of a match.

Prior to the loading of the incoming destination address bit into the CAM cell 108, the match line 134 is electrically charged with a voltage potential representing a logical one. This match line 134 interconnects all CAM cells 108 throughout the row within the CAM 100. In other words, all CAM cells 108 within each row of the CAM 100 are coupled to the same match line 134. Thus, if even only one bit is different among the 48 bits compared within the row, the original charge placed on the match line 134 will be discharged by the pull-down MOSFET 132 corresponding to the non-matching bits. On the other hand, if a match does occur, the logical one initially placed on the match line 134 remains and is reflected in a logical one signal occurring as the match result signal illustrated in FIG. 7.

The CAM cell structure 108 according to the present invention takes advantage of the ability to interconnect MOSFETs within an integrated circuit structure such that an electrical charge can be placed on a signal path or node therein (e.g., the match line 134) and be reliably maintained for a sufficient period of time until actively discharged. By electrically charging the match line 134 and coupling it to multiple pull-down MOSFETs 132 in a wired-OR configuration, the address bit comparison as described above can be accomplished very quickly. As described above, if any one bit within the 48 bits representing the incoming destination address does not match the corresponding bit within the reference address, the corresponding pull-down MOSFET 132 will rapidly discharge the match line 134 and thereby immediately indicate non-matching addresses.

However, the CAM cell structure 108 according to the present invention need not be limited to the use of an electrically charged node with multiple MOSFETs coupled thereto in a wired-OR configuration. A logical OR operation with the appropriate logic gates or wired-OR configuration may be used with an active voltage supplying the logical one rather than a stored electrical charge.

Figure 9:
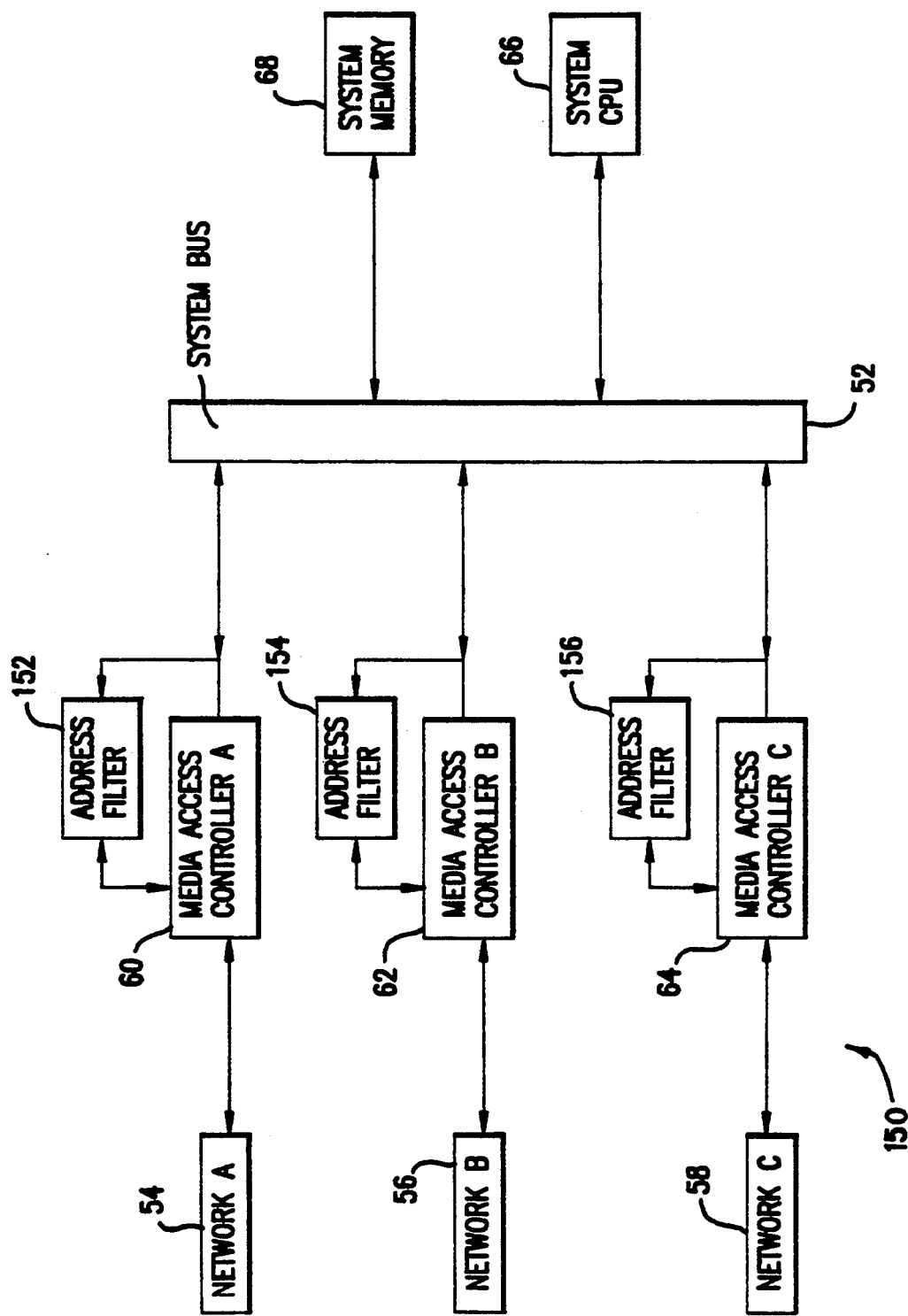
FIG. 9 illustrates in simplified functional block diagram form a network bridge supporting three networks using media access controllers in accordance with the present invention.

FIG. 9 illustrates in simplified functional block diagram form a network bridge 150 bridging three networks 54, 56, 58 communicating via MACs 60, 62, 64 in accordance with the present invention. As shown in FIG. 9, each of the MACs 60, 62, 64 supports the use of an associated external address filter 152, 154, 156. The network bridge 150 of FIG. 9 shows the bridging of three networks 54, 56, 58, but the precise number of networks which may be bridged is not limited by the MAC of the present invention.

Figure 10A:
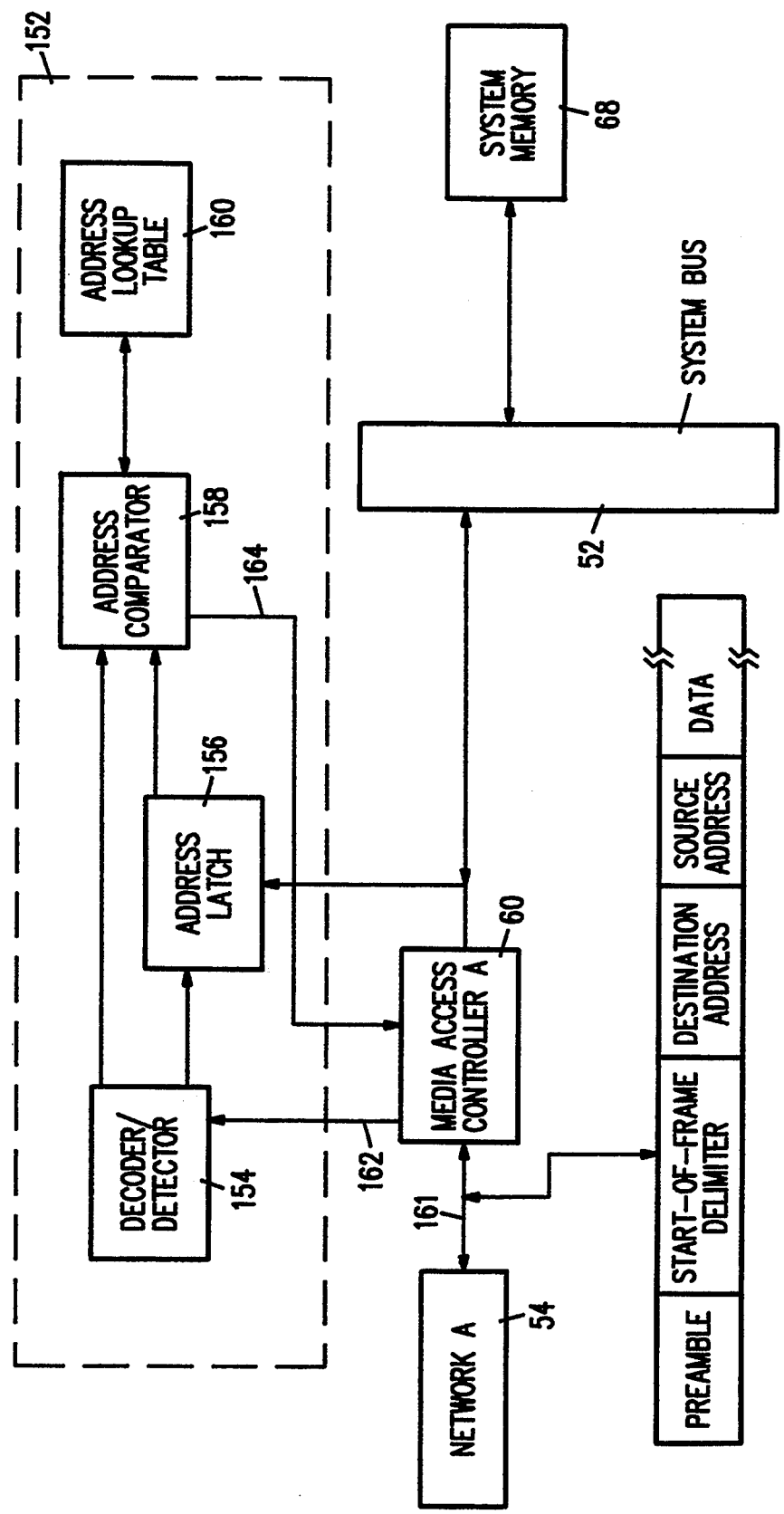
FIGS. 10A, 10B and 10C illustrate in simplified functional block diagram form the interface supports for external address filtering provided by a media access controller in accordance with the present invention.

FIG. 10A illustrates in greater detail the interface between a MAC 60 in accordance with the present invention and an external address filter 152. The external address filter 152 includes a decoder/detector 154, an address latch 156, an address comparator 158 and an address look-up table 160. The MAC 60 receives from the network 54 a signal 161 which includes preamble data, start-of-frame delimiter ("SFD"), destination address, source address and an additional data field (of variable octet lengths, e.g. 46 to 1500 bytes) as shown (e.g. as part of a standard IEEE 802.3 packet).

The MAC 60 sends a signal 162 to the decoder/detector 154 telling it when the destination address field has arrived and is being transferred to the system bus 52. The address latch 156 latches the destination address information and provides it to the address comparator 158. The address comparator 158 compares this destination address field to its pre-programmed addresses located in its address lookup table 160. If a match occurs, thereby indicating that the incoming data packet is to be received and buffered by the system memory 68, the external address filter 152 does nothing more. However, if no match occurs, thereby indicating that the incoming data packet is not to be buffered, a packet reject signal 164 is activated and sent from the address comparator 158 to the MAC 60. The MAC 60 then stops relaying data to the system memory 68 theretofore used to buffer the incoming data packet and resets its memory pointer address. The system memory 68 is then free to reclaim its memory registers used to buffer the incoming data packet.

It will be appreciated that the MAC 60 in accordance with the present invention is not limited to recognition and capture of only the destination address field. Conceivably any data bit field within the incoming data packet may be used for address matching within the external address filter 152. For example, a portion of the incoming data field or the source address field may be latched and compared within the address latch 156 and address comparator 158, respectively.

The interface supplied by the MAC 60 to the external address filter 152, particularly the signal 162 sent to the decoder detector 154, supports both spanning tree and source routing algorithms. A spanning tree algorithm causes the address filter to "learn" the source addresses of the systems within its associated network and filter out incoming data packets intended for reception by systems within the same network as the system which is sourcing the data packets. A source routing algorithm examines a byte field within the data field of the incoming data packet and, based upon pre-programmed information, decides whether to filter out that incoming data packet.

For supporting the spanning tree algorithm, the MAC 60 sends a three-bit wide signal 162 to the decoder/detector 154 informing it when the destination address field has arrived. For supporting the source routing algorithm, the MAC 60 supplies a signal 162 consisting of a "carrier sense" signal (signal indicative of the presence of a data packet within the network) and the deserialized received NRZ data and recovered data clock.

Figure 10B:
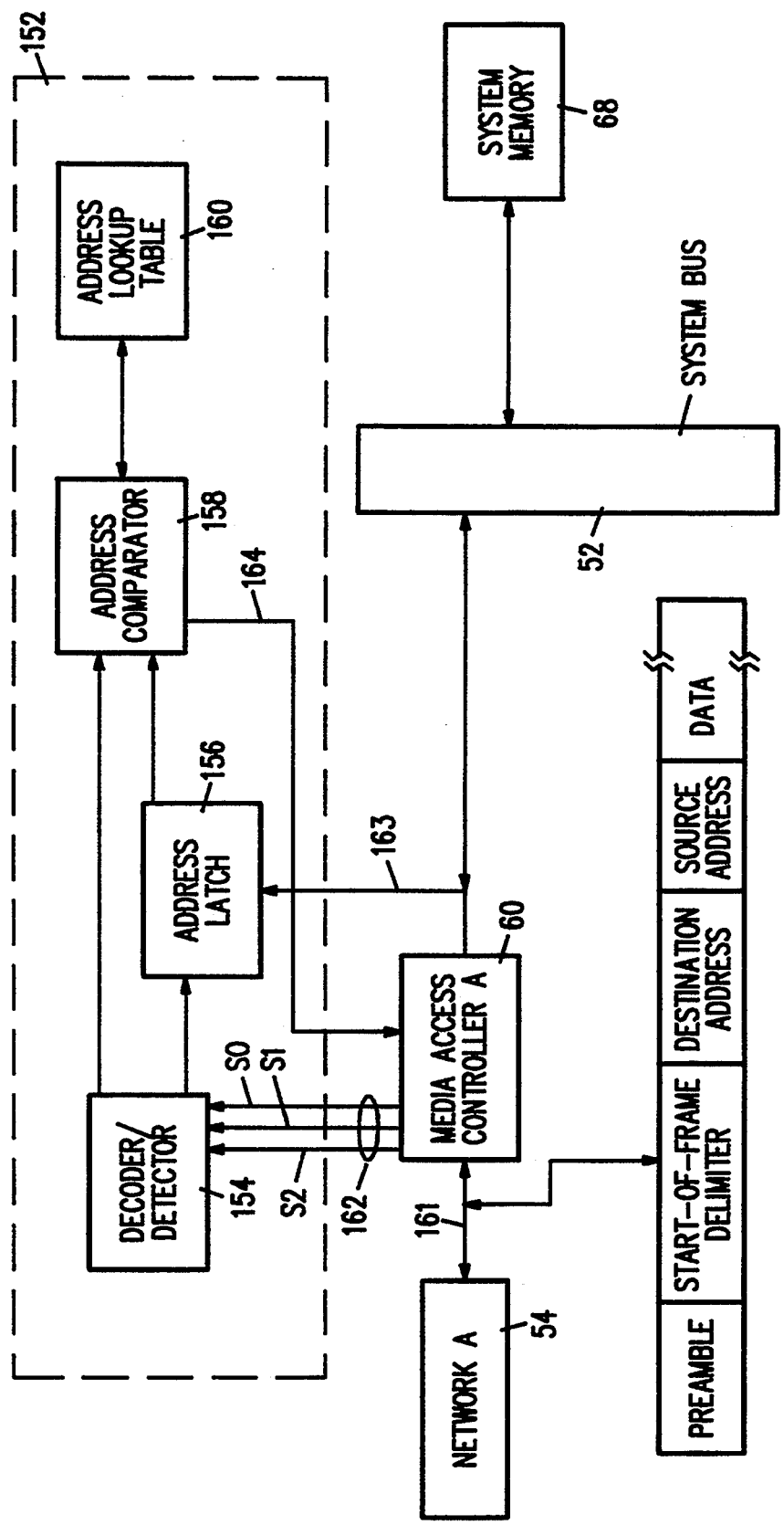

Referring to FIG. 10B, the interface between the MAC 60 and external address filter 152 when supporting a spanning tree algorithm can be better understood. The interface signal 162 from the MAC 62 to the address filter 152 consists of a three-bit wide status signal to the decoder/detector 154. The three parallel bits (e.g. "S2", "S1", "S0") have eight possible bit patterns, one of which (e.g. "010") is used to indicate whether the destination (e.g. or source) address is currently being received by the MAC 60 via its serial input signal 161.

Figure 10C:
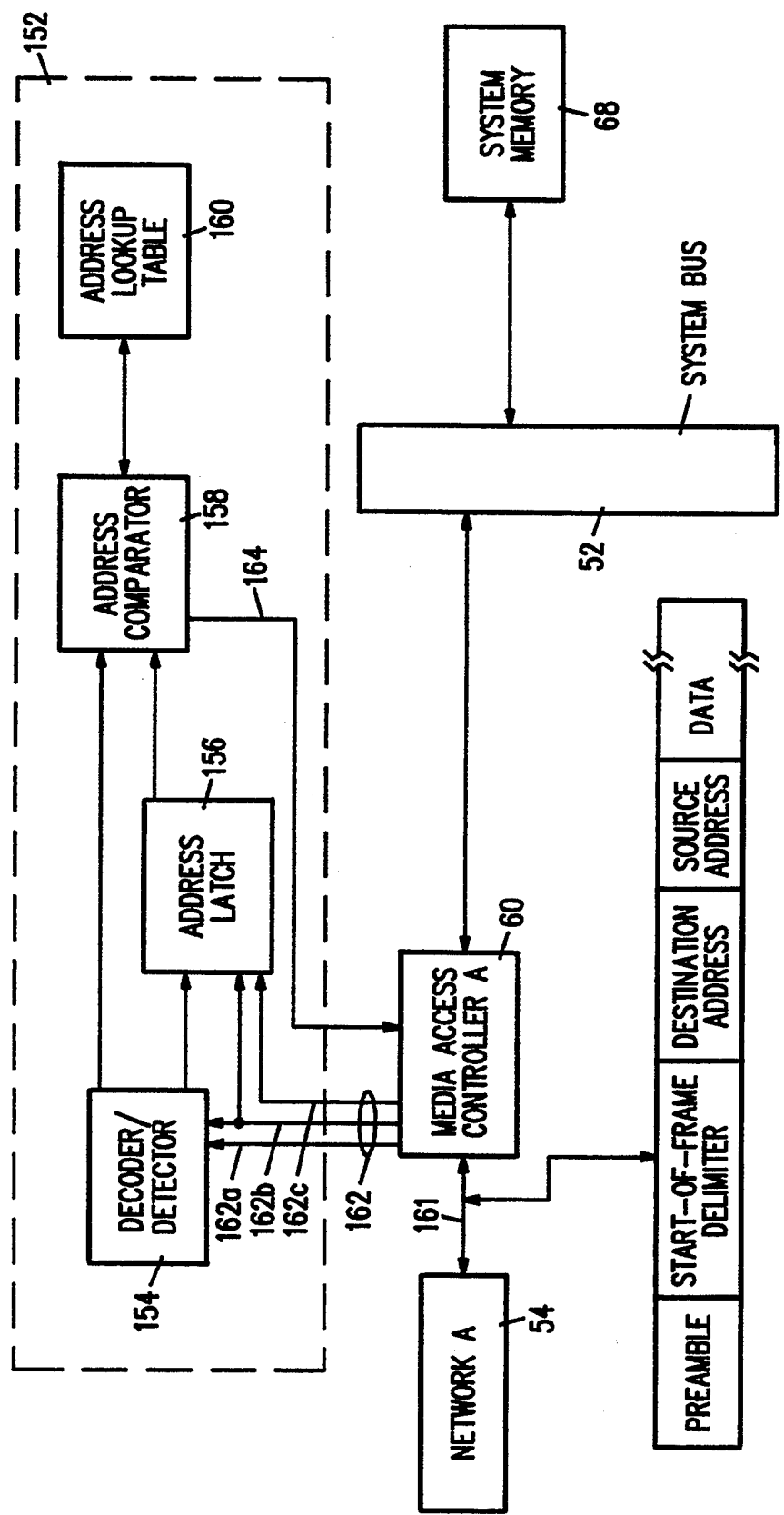

Referring to FIG. 10C, the interface between the MAC 60 and external address filter 152 when supporting the source routing algorithm can be better understood. In this configuration, the interface signal 162 from the MAC 60 to the address filter 152 consists of three separate signals 162a, 162b, 162c. One signal 162a is a status signal referred to as the carrier sense signal which is asserted, i.e. becomes active, on a selected data state transition (e.g. the first valid high-to-low transition) in the received data within the incoming signal 161. The asserted carrier sense signal 162a indicates the status of the incoming data signal 162b (i.e. whether data is in fact arriving) and normally remains active for some period of time after the last data bit has been received (e.g. 1.5 bit periods). This signal 162a is received by the decoder/detector 154. The second signal 162b is the NRZ data which has been decoded by the MAC 60 from the Manchester encoded data of the input signal 161. This signal 162b is received by the decoder/detector 154 and address latch 156. The third signal 162c is the data clock, i.e. the data clock associated with the NRZ data (162b) and which was decoded by the MAC 60 from the Manchester encoded data stream in the incoming signal 161. This decoded data clock 162c is received by the address latch 156 and used to clock in the associated NRZ data 162b.

The address latch 156, address comparator 158 and address lookup table 160 within the external address filter 152 may be replaced with a CAM 100 according to the present invention. (See FIG. 7 and discussion above therefor.) As described above, the CAM 100 provides an incoming data storage capability similar to that of the address latch 156, a reference data storage capability similar to that of the address lookup table 160, and a data comparison capability similar to that of the address comparator 158. Thus, the address filtering performed by the external address filter 152 could be accomplished with a speed comparable to that made possible by the CAM 100 in accordance with the present invention.

Figure 4:
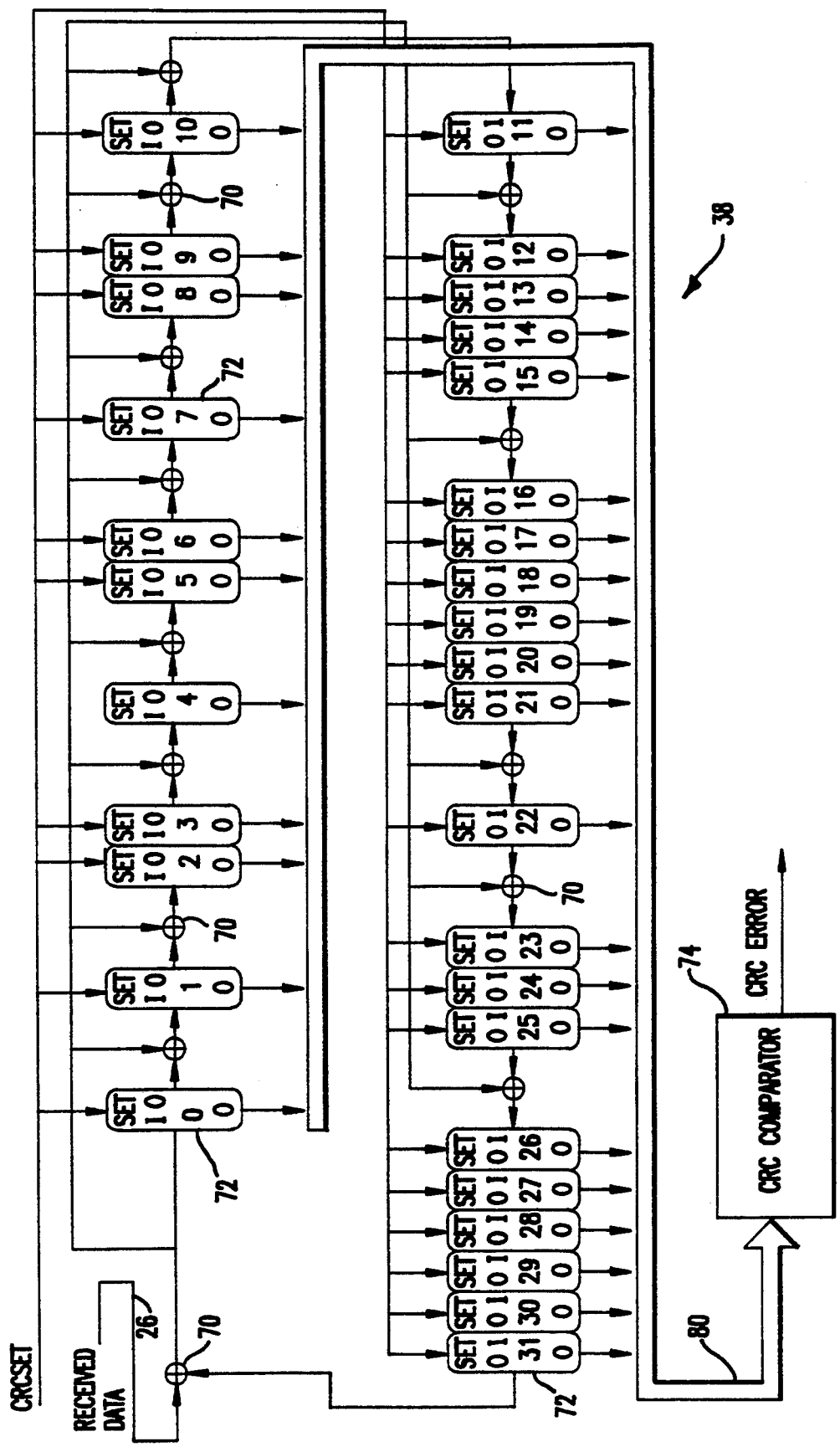
FIGS. 4 and 5 illustrate in logic diagram form a typical CRC checker.
Figure 5:
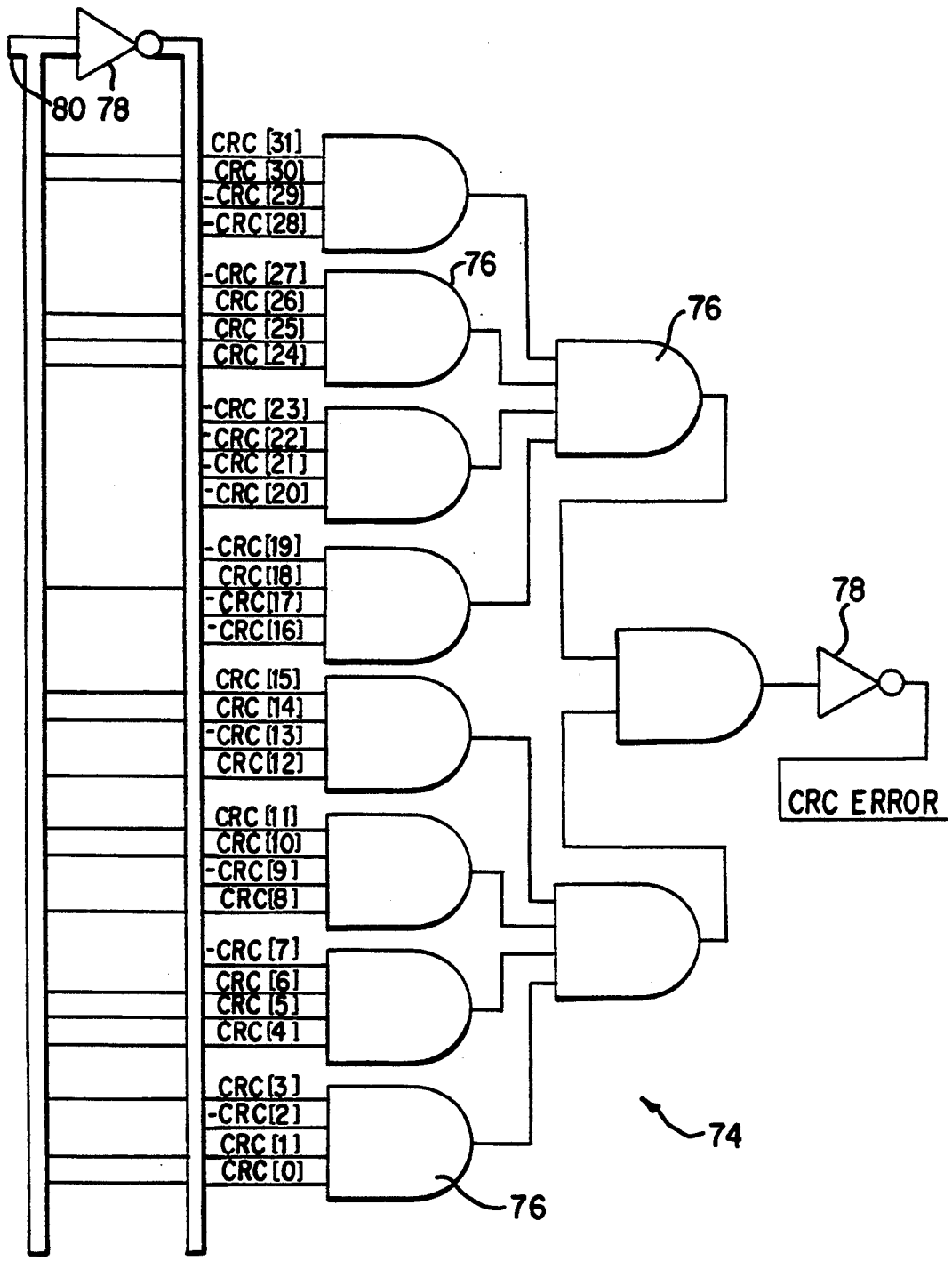
Figure 11:
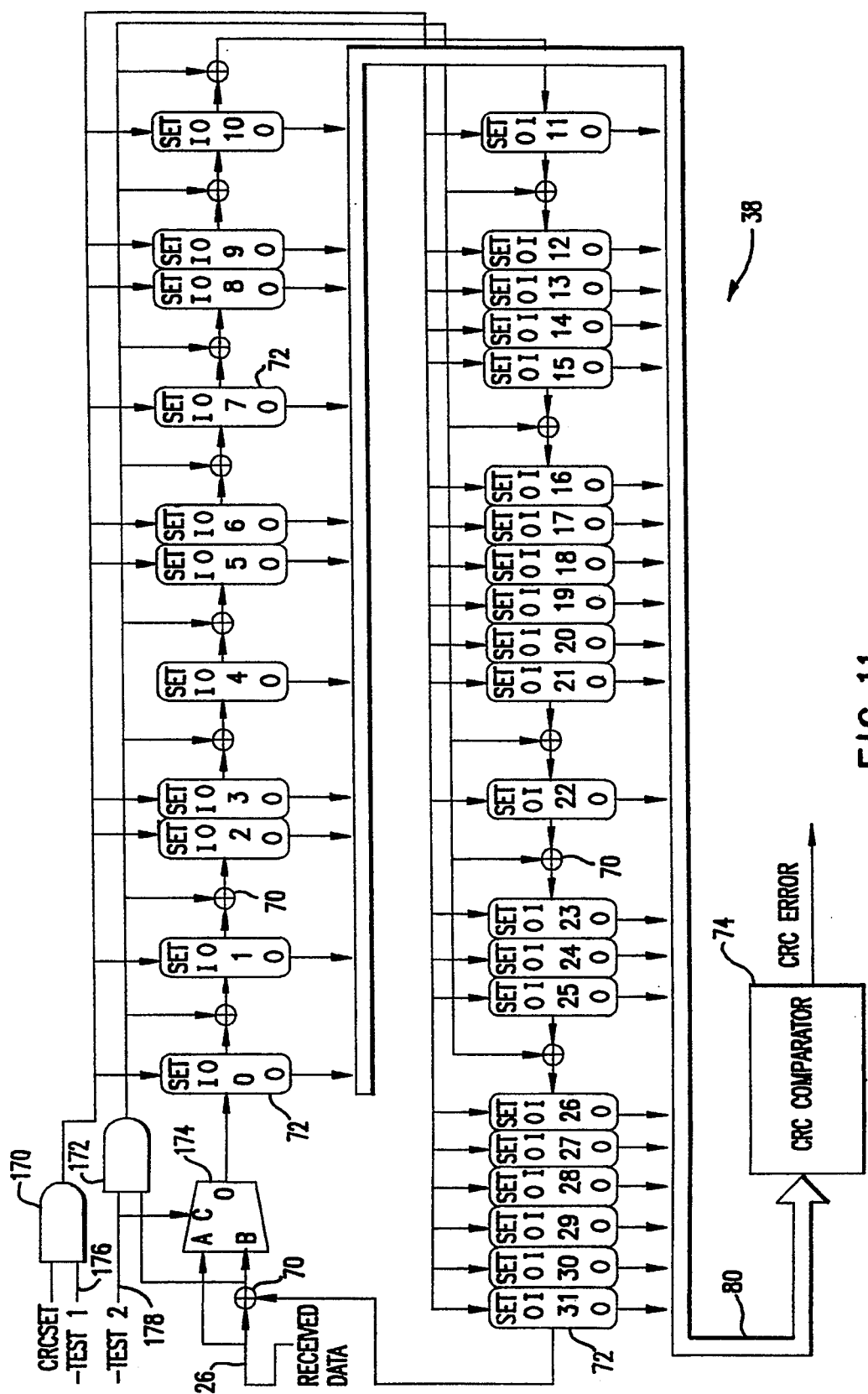
FIG. 11 illustrates in simplified logic diagram form a CRC checker in accordance with the present invention.

FIG. 11 illustrates in logic diagram form a CRC checker in accordance with the present invention, wherein three additional logic elements have been added to the conventional CRC checker 38 illustrated in FIG. 4 to simplify its testability. These additional elements include two AND gates 170, 172 and a dual input multiplexer 174.

When connected as shown in FIG. 11, these additional elements 170, 172, 174, along with two user generated input test signals 176, 178, greatly simplify the testing of the CRC checker 38. The first user generated test signal 176, active at a logical zero, removes the CRC set signal from the shift register elements 72, allowing the shift register elements 72 to operate normally. The second user generated test signal 178, also active at a logical zero, causes a logical zero to be outputted from its AND gate 172 and applied at one input of each of the exclusive-OR gates 70, thereby effectively reducing the exclusive-OR gates to the functional equivalents of simple pass gates.

The second user generated test signal 178 further causes the multiplexer 174 to accept the incoming data bits 26 directly, without passing through the input exclusive-OR gate 70. Thus, the incoming data 26 is shifted directly into the shift register elements 72 and through the exclusive-OR gates 70, now serving as simple pass gates. This allows the desired bit pattern for testing to be inputted directly without the burdensome bit permutation computations required to counteract the logical effects of the shifting and exclusive-OR operations. The final bit patterns 80, now identical to the bit patterns of the incoming data 26, are then compared as usual within the CRC comparator 74.

Much less test time is required for the CRC checker 38 illustrated in FIG. 11 since only 33 different CRC bit test patterns need to be inputted rather than $2^{32}$ patterns. The CRC bit test pattern intended to produce no CRC error may be inputted directly first. Then, each one of the 32 bits of that test pattern may be inverted, or "toggled," one at a time, with the resulting test pattern inputted directly. Thus, only 33 different CRC bit test patterns need to be inputted to fully test the CRC checker illustrated in FIG. 11.

Figure 12:
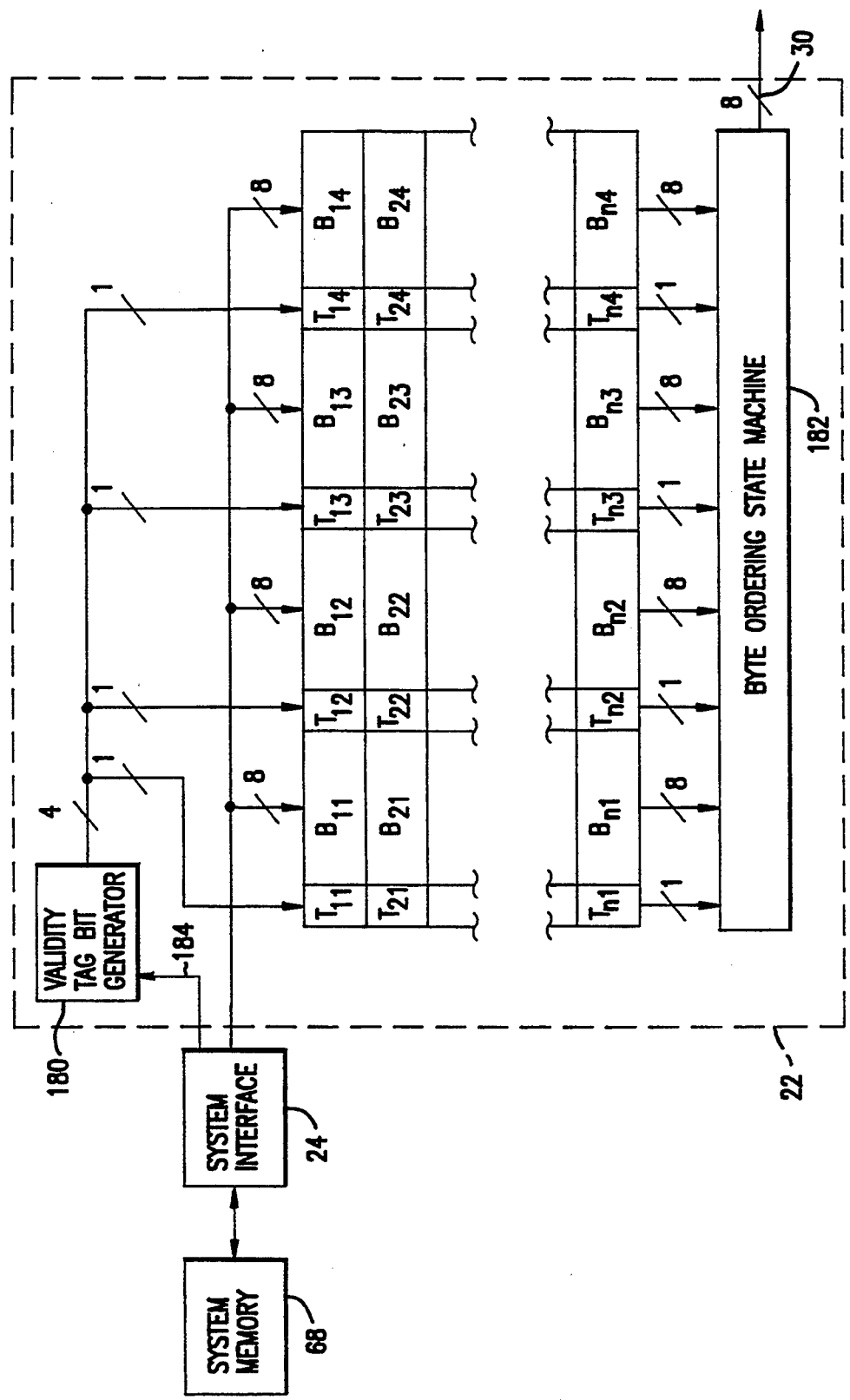
FIG. 12 illustrates in simplified functional block diagram form the transmitter FIFO of a media access controller in accordance with the present invention.

FIG. 12 illustrates the architecture of a transmitter FIFO 22 in accordance with the present invention. A transmitter FIFO 22 in accordance with the present invention consists of a row-column matrix of memory elements. Each row has four byte-wide columns for storing the data bytes slated for transmission into the network. Associated with each byte-wide memory element is a single "validity tag bit" which indicates whether the data byte is valid or invalid data. This matrix may be visualized as illustrated in FIG. 12, where $B_{xy}$ indicates a byte-wide memory element and $T_{xy}$ indicates the associated validity tag bit ("x" represents the row number and "y" represents the column number).

In the illustrated embodiment of the transmitter FIFO 22 according to the present invention, eight rows and four columns are used. This is consistent with the double-word or four-byte data fetches used when a 32-bit wide data bus is used within the MAC according to the present invention. However, the precise number of rows or columns is not critical to the transmitter FIFO 22 according to the present invention. For example, two columns may be used if a 16-bit wide data bus and single-word or two-byte data fetches are used.

As the data bytes are fetched from the system memory 68 and passed through the system interface 24 for storage within the transmitter FIFO 22, the need for screening out invalid data bytes and/or realigning the data byte boundaries is eliminated. The data bytes are transferred directly into the transmitter FIFO 22 where a validity tag bit generator 180 assigns the appropriate logic level to the validity tag bit $T_{xy}$ corresponding to each data byte $B_{xy}$ to indicate whether that data byte $B_{xy}$ is valid or invalid data. Later, when reading out the data bytes $B_{xy}$ for transfer to the serializer and transmitter interface 18, a byte ordering state machine 182 examines each tag bit $T_{xy}$ and, based upon its status, reads out only valid data bytes $B_{xy}$. Thus, the software and processing time otherwise required to sort and realign the valid data bytes $B_{xy}$ are no longer needed.

The validity tag bit generator 180 assigns the appropriate values to the tag bits $T_{xy}$ by examining information 184 received from the system interface 24 which indicates the start address and total number of data bytes within each data fragment fetched from the system memory 68. This allows the validity tag bit generator 180 to assign the appropriate values to the tag bits $T_{xy}$ and store them concurrently with the storage of their corresponding data bytes $B_{xy}$. By way of example only, this tag bit value assignment and storage may be accomplished through the use of multiplexers (not shown), or shift registers in which the tag bit values $T_{xy}$ are stored and shifted out concurrently with storage of the incoming data bytes $B_{xy}$. Alternatively and also by way of example only, this tag bit value assignment and storage may be accomplished by storing the appropriate tag bit values $T_{xy}$ within firmware, with retrieval thereof concurrently with storage of the incoming data bytes $B_{xy}$.

It should be understood that various alternatives to the embodiments of the present invention described herein may be employed in practicing the present invention. It is intended that the following claims define the scope of the present invention and that structures and methods within the scope of these claims and their equivalence be covered thereby.

What is claimed is:

1. A media access controller for transferring digital data between a digital system and a digital network, said media access controller comprising:

digital data reception means for receiving incoming digital data including corresponding data destination addresses from a digital network, and for transferring a first portion of said received incoming digital data to at least one of a plurality of data destination units within a digital system, and further for selectively transferring a second portion of said received incoming digital data to said at least one of said plurality of data destination units within said digital system;

digital data transmission means for receiving outgoing digital data from said digital system and for transmitting said received outgoing digital data into said digital network; and off-line address filtering means for capturing said received data destination addresses, wherein said off-line address filtering means selectively inhibits said transferring of said second portion of said received incoming digital data to said at least one of said plurality of data destination units within said digital system in accordance with said captured data destination addresses after said first portion of said received incoming digital data has been transferred.

2. A media access controller as recited in claim 1, wherein said digital data reception means comprises a deserializer for converting said incoming digital data received from said digital network from a serial format to a parallel format.

3. A media access controller as recited in claim 1, wherein said digital data transmission means comprises a serializer for converting said outgoing digital data received from said digital system from a parallel format to a serial format.

4. A media access controller as recited in claim 1, wherein said off-line address filtering means comprises a content addressable memory.

5. A media access controller as recited in claim 4, wherein said content addressable memory comprises:

reference data storage means for selectively prestoring a plurality of reference data units;

enablement means for storing a plurality of enablement bits corresponding to said plurality of selectively prestored reference data units;

incoming data storage means for storing an incoming data unit;

data comparison means for comparing said stored incoming data unit simultaneously with each one of said plurality of selectively prestored reference data units; and match indicator means for providing a match signal in accordance with said plurality of stored enablement bits, wherein said match signal indicates whether said stored incoming data unit matches at least one of said plurality of selectively prestored reference data units.

6. A media access controller as recited in claim 5, wherein said plurality of reference data units comprises a plurality of bytes of digital data representing destination address information for said incoming digital data received from said digital network.

7. A media access controller as recited in claim 5, wherein said reference data storage means comprises memory means for dynamically loading said plurality of reference data units without first requiring being reset.

8. A media access controller as recited in claim 5, wherein said incoming data storage means comprises a digital register.

9. Digital data rejection means for selectively rejecting incoming digital data, wherein said rejection means analyzes selective portions of said incoming digital data and selectively provides a data reject signal, said digital data rejection means comprising:

reference data storage means for receiving and storing at least one reference data set;

data packet status decoder means for receiving and decoding a data status signal representing arrival status of an incoming digital data packet from a data source and for selectively providing in accordance therewith a comparison enablement signal;

data latching means for latching a first portion of said incoming digital data packet from said data source in accordance with said comparison enablement signal; and data comparator means for comparing said latched first portion of said incoming digital data packet with said stored at least one reference data set and for outputting an active data reject signal when said comparison yields no match between said latched first portion of said incoming digital data packet and said stored at least one reference data set, said data comparator means being coupled to said reference data storage means and to said data latching means;

wherein a second portion of said incoming digital data packet is transferred from said data source to a data destination prior to said outputting of said active data reject signal, and wherein transferring of a subsequent third portion of said incoming digital data packet from said data source to said data destination is prevented by said outputting of said active data reject signal.

10. Digital data rejection means as recited in claim 9, wherein said reference data storage means comprises a memory.

11. Digital data rejection means as recited in claim 10, wherein said reference data storage means comprises a random access memory.

12. Digital data rejection means as recited in claim 9, wherein said data packet status decoder means comprises a decoder for receiving a digital status signal comprising a plurality of bits.

13. Digital data rejection means as recited in claim 9, wherein said data packet status decoder means comprises a decoder for receiving said incoming digital data packet.

14. Digital data rejection means as recited in claim 9, wherein said data latching means comprises a latch.

15. Digital data rejection means as recited in claim 9, wherein said data comparator means comprises an address comparator.

16. Digital data rejection means as recited in claim 9, wherein said reference data storage, data latching and data comparator means each constitute a portion of a content addressable memory.

17. A media access controller for transferring digital data between a digital system and a digital network, said media access controller comprising:

digital data reception means for receiving digital data from a digital network and for transferring said data to a digital system;

digital data transmission means for receiving digital data from said digital system and for transmitting said data into said digital network; and address filtering means for selectively inhibiting said transferring of said data to said digital system;

wherein said address filtering means comprises:

reference data storage means for prestoring a plurality of reference data units;

incoming data storage means for storing an incoming data unit;

data comparison means for comparing said stored incoming data unit simultaneously with each one of said plurality of prestored reference data units; and match indicator means for indicating whether said stored incoming data unit matches at least one of said plurality of prestored reference data units;

wherein said reference data storage means comprises a plurality of cross-coupled pairs of digital inverters, each one of said pairs of inverters being mutually coupled to maintain one bit and the inverse of said bit of said reference data units.

18. A media access controller for transferring digital data between a digital system and a digital network, said media access controller comprising:

digital data reception means for receiving digital data from a digital network and for transferring said data to a digital system;

digital data transmission means for receiving digital data from said digital system and for transmitting said data into said digital network: and address filtering means for selectively inhibiting said transferring of said data to said digital system;

wherein said address filtering means comprises:

reference data storage means for prestoring a plurality of reference data units;

incoming data storage means for storing an incoming data unit;

data comparison means for comparing said stored incoming data unit simultaneously with each one of said plurality of prestored reference data units; and match indicator means for indicating whether said stored incoming data unit matches at least one of said plurality of prestored reference data units;

wherein said data comparison means comprises a plurality of pairs of transistors, each one of said pairs of transistors being coupled in a totem-pole topology, and each one of said pairs of transistors having bit inputs for receiving voltages representing one bit and the inverse of said bit of said reference data units, and each one of said pairs of transistors further having bias terminals to receive a bias voltage across said totem-pole topology, said bias voltage comprising voltages representing one bit and the inverse of said bit of said incoming data.

19. A media access controller for transferring digital data between a digital system and a digital network, said media access controller comprising:

digital data reception means for receiving incoming digital data including a corresponding data destination address from a digital network and for transferring said received incoming digital data to at least one of a plurality of data destination units within a digital system;

digital data transmission means for receiving outgoing digital data from said digital system and for transmitting said received outgoing digital data into said digital network; and address filtering means for capturing said received data destination address, and for interrupting said transferring of said received incoming digital data to said at least one of said plurality of data destination units within said digital system in accordance with said captured data destination address, wherein a first portion of said received incoming digital data is transferred to said at least one of said of data destination units within said digital system prior to said interrupting of said data transferring;

wherein said address filtering means comprises:

reference data storage means for prestoring a plurality of reference data units;

incoming data storage means for storing an incoming data unit;

data comparison means for comparing said stored incoming data unit simultaneously with each one of said plurality of prestored reference data units; and match indicator means for indicating whether said stored incoming data unit matches at least one of said plurality of prestored reference data units;

wherein said match indicator means comprises a plurality of pull-down transistors having a plurality of transistor outputs mutually coupled in a wired-OR configuration and having a plurality of transistor inputs coupled to said plurality of data comparison means.

20. A media access controller for transferring digital data between a digital system and a digital network, said media access controller comprising:

digital data reception means for receiving incoming digital data including a corresponding data destination address from a digital network and for transferring said received incoming digital data to at least one of a plurality of data destination units within a digital system;

digital data transmission means for receiving outgoing digital data from said digital system and for transmitting said received outgoing digital data into said digital network; and address filtering means for capturing said received data destination address, and for interrupting said transferring of said received incoming digital data to said at least one of said plurality of data destination units within said digital system in accordance with said captured data destination address, wherein a first portion of said received incoming digital data is transferred to said at least one of said plurality of data destination units within said digital system prior to said interrupting of said data transferring;

wherein said address filtering means comprises:

reference data storage means for prestoring a plurality of reference data units;

incoming data storage means for storing an incoming data unit;

data comparison means for comparing said stored incoming data unit simultaneously with each one of said plurality of prestored reference data units; and match indicator means for indicating whether said stored incoming data unit matches at least one of said plurality of prestored reference data units;

wherein said match indicator means comprises a plurality of logic gates coupled to said plurality of data comparison means.

21. A media access controller for transferring digital data between a digital system and a digital network, said media access controller comprising:

digital data reception means for:

receiving incoming digital data which includes data, a data clock and a data status signal from a digital network, selectively transferring a first portion and then a second portion of said received incoming digital data to at least one of a plurality of data destination units within a digital system, outputting said data, data clock and data status signal, and receiving a data reject signal after said transferring of said first portion of said received incoming digital data and in accordance therewith ceasing said transferring of said second portion of said received incoming digital data;

digital data transmission means coupled to said digital data reception means for receiving outgoing digital data from said digital system and for transmitting said received outgoing digital data into said digital network; and address filtering means coupled to said digital data reception means for receiving said outputted data, data clock and data status signal and selectively providing in accordance therewith said data reject signal.

22. A media access controller as recited in claim 21, wherein said address filtering means comprises a content addressable memory.

23. Digital data rejection means for selectively rejecting incoming digital data, wherein said rejection means analyzes selected portions of said incoming digital data and selectively provides a data reject signal, said digital data rejection means comprising:

reference data storage means for receiving and storing at least one reference data set;

data packet status decoder means for receiving and decoding a data status signal representing a status of an incoming digital data packet from a data source and for selectively providing in accordance therewith a comparison enablement signal;

data latching means coupled to said data packet status decoder means for receiving said incoming digital data packet and a data clock associated therewith, and for receiving said comparison enablement signal and in accordance therewith latching a first portion of said received incoming digital data packet; and data comparator means coupled to said reference data storage means and said data latching means for receiving and comparing said stored at least one reference data set and said latched first portion of said incoming digital data packet, and for outputting an active data reject signal when said comparison yields no match therebetween;

wherein a second portion of said incoming digital data packet is transferred from said data source to a data destination prior to said outputting of said active data reject signal, and wherein transferring of a subsequent third portion of said incoming digital data packet from said data source to said data destination is prevented by said outputting of said active data reject signal.

24. Digital data rejection means as recited in claim 23, wherein said reference data storage means, data latching means and data comparator means each constitute a portion of a content addressable memory.

* * * * *

UNITED STATES PATENT AND TRADEMARK OFFICE
CERTIFICATE OF CORRECTION

PATENT NO. : 5,379,289
DATED : January 3, 1995
INVENTOR(S) : Edwin Z. DeSouza et al.

It is certified that error appears in the above-indentified patent and that said Letters Patent is hereby corrected as shown below:

In Column 15, at the beginning of line 66,
    please insert -- plurality -- before "of".

Signed and Sealed this

Eighteenth Day of April, 1995

Attest:

BRUCE LEHMAN

*Commissioner of Patents and Trademarks*

*Attesting Officer*